(12) United States Patent
Hayashi

(10) Patent No.: US 10,318,021 B2
(45) Date of Patent: Jun. 11, 2019

(54) STERILIZABLE OPTICAL MOUSE

(71) Applicant: Susa Inc., Okayama (JP)

(72) Inventor: Yukinori Hayashi, Okayama (JP)

(73) Assignee: Susa, Inc., Okayama-shi, Okayama (JP)

( * ) Notice: Subject to any disclaimer, the term of this patent is extended or adjusted under 35 U.S.C. 154(b) by 0 days.

(21) Appl. No.: 15/379,583

(22) Filed: Dec. 15, 2016

(65) Prior Publication Data
US 2017/0308188 A1    Oct. 26, 2017

(30) Foreign Application Priority Data

Apr. 22, 2016   (JP) ................................. 2016-085801

(51) Int. Cl.
*G06F 3/0354* (2013.01)
*H02J 7/35* (2006.01)
(Continued)

(52) U.S. Cl.
CPC ............ *G06F 3/03543* (2013.01); *H02J 7/35* (2013.01); *H05K 1/0203* (2013.01); *H02J 7/025* (2013.01); *H02J 50/12* (2016.02); *Y02P 90/50* (2015.11)

(58) Field of Classification Search
CPC ............ G06F 3/03543; G06F 3/03541; H05K 1/0203; H02J 7/35; H02J 7/025; H02J 50/12; Y02P 90/50
See application file for complete search history.

(56) References Cited

U.S. PATENT DOCUMENTS 6,304,246 B1 * 10/2001 Kuth ..................... G06F 3/0317
                                                    345/157
6,304,459 B1    10/2001 Toyosato et al.
(Continued)

FOREIGN PATENT DOCUMENTS

JP    H08-314631 A    11/1996
JP    H09-319515 A    12/1997
(Continued)

OTHER PUBLICATIONS

Article by Kyoko Sugimoto, entitled "Washable! Sanwa Direct stared to sell a waterproof silicon mouse", Gazette Communication, [Online], Sep. 3, 2010, [searched on Sep. 2, 2016], Internet <URL: http://getnews.jp/archives/75274> (Document showing a well-known technique) with English Translation.
(Continued)

*Primary Examiner* — Temesghen Ghebretinsae
*Assistant Examiner* — Ivelisse Martinez Quiles
(74) *Attorney, Agent, or Firm* — McCormick Paulding & Huber LLP

(57) ABSTRACT

The mouse includes a circuit board having a position detecting unit for detecting the movement of the mouse, a switch for operating the mouse, and a wireless communication unit for wirelessly transmitting the data related to the movement detected at the position detecting unit and the data related to the operation of the switch to the outside. The circuit board and a power source are mounted on a bottom part. The bottom part is covered with a housing. Electronic devices including the circuit board, the power source, and other devices are accommodated in the internal space formed by the bottom part and the housing that have resistance to and strength against the change in pressure and temperature. The entire areas of the outer surfaces of the bottom part and the housing are covered with a resin cover having elasticity, heat resistance, and waterproofness. The cover seals the internal space formed by the bottom part and the housing. The electronic devices are enclosed with a heat insulating sheet.

5 Claims, 7 Drawing Sheets

(51) Int. Cl.
  H05K 1/02 (2006.01)
  H02J 7/02 (2016.01)
  H02J 50/12 (2016.01)

(56) References Cited

U.S. PATENT DOCUMENTS

| | | | | |
|---|---|---|---|---|
| 6,552,713 | B1* | 4/2003 | Van Brocklin | G06F 1/1616 345/156 |
| 8,049,123 | B2 | 11/2011 | Hou et al. | |
| 2002/0061739 | A1* | 5/2002 | Nakamura | G06F 3/03543 455/343.1 |
| 2003/0094355 | A1* | 5/2003 | Angst | H01H 13/70 200/302.1 |
| 2006/0227108 | A1* | 10/2006 | Meyer | G06F 3/03543 345/163 |
| 2007/0296700 | A1* | 12/2007 | Lane | G06F 3/0317 345/166 |
| 2009/0073123 | A1* | 3/2009 | Raz | G06F 3/03543 345/166 |
| 2009/0184925 | A1* | 7/2009 | Chien | G06F 3/03543 345/163 |
| 2010/0096963 | A1* | 4/2010 | McLaughlin | G06F 1/1626 312/223.1 |
| 2013/0334523 | A1* | 12/2013 | Yamazaki | H01L 29/78693 257/43 |
| 2015/0150646 | A1* | 6/2015 | Pryor | G06F 3/0362 345/174 |
| 2015/0193023 | A1* | 7/2015 | Odgers | G06F 3/03543 345/163 |
| 2015/0199062 | A1* | 7/2015 | Lang | G06F 3/044 345/174 |
| 2016/0003404 | A1* | 1/2016 | Shibata | C04B 38/00 428/192 |
| 2016/0085322 | A1* | 3/2016 | Park | G06F 1/266 345/163 |
| 2016/0195902 | A1* | 7/2016 | Huh | G06F 1/1652 345/156 |
| 2017/0285775 | A1* | 10/2017 | Park | G06F 3/03545 |

FOREIGN PATENT DOCUMENTS

| | | | |
|---|---|---|---|
| JP | 11110130 A | * | 4/1999 |
| JP | H11-110130 A | | 4/1999 |
| JP | 2000-29620 A | | 1/2000 |
| JP | 2008-65733 A | | 3/2008 |
| JP | 2008065733 A | * | 3/2008 |
| JP | 2010-211462 A | | 9/2010 |
| JP | 2010211462 A | * | 9/2010 |
| TW | 498189 B | | 8/2002 |
| TW | 201108040 A | | 3/2011 |
| TW | M432083 U | | 6/2012 |

OTHER PUBLICATIONS

Japanese Office Action relating to Japanese Patent Application No. 2016-085801, dated Sep. 6, 2016 with English Translation.
Japanese Article, Sep. 28, 2013, No. 415132, P-7294.
Japanese Office Action relating to Japanese Patent Application No. 2016-085801, dated Sep. 13, 2016.

* cited by examiner

STERILIZABLE OPTICAL MOUSE

CROSS-REFERENCE TO RELATED APPLICATION

The present application claims priority from Japanese Patent Application No. 2016-85801 filed on Apr. 22, 2016, the content of which is hereby incorporated by reference into this application.

TECHNICAL FIELD OF THE INVENTION

The present invention relates to a mouse as an input device for a computer.

BACKGROUND OF THE INVENTION

There are various kinds of mouse devices used as input devices for computers. Among those, optical mouse devices are widely used due to their intuitive usability for users. An optical mouse emits light from its bottom, senses the light reflected back from an object such as a desk with a built-in optical sensor, and sends the sensed data to a computer. The optical mouse also detects a click operation performed on a click button on the upper front surface or a side surface of the mouse, and sends the detected data to the computer. Through these operations, the user can move a pointer and select a menu on a display screen of the computer, for example.

Computers are now used in various places. With the use of computers expanding, mouse as input device for those computers are required to have properties suited for their usage conditions. For example, there are needs for mouse that can be used in wet places using water like on board a ship, in kitchens, or in bathrooms and the like. A mouse accommodates a light-emitting device such as an LED, an optical sensor such as an image sensor and an optical coupler, a signal processing IC, a resistive element, and other electronic circuits. These electronic components are susceptive to humidity. If some moisture enters a mouse, the electronic circuits may be damaged, resulting in the failure of the mouse.

There are needs for mouse devices that can be used in clean places requiring hygiene like in operating rooms or in workplaces for processing meat or fish, for operating personal computers. In recent years, in cardiac catheter operations, mouse has been used for handling CT data in a similar way to handling CADCAM data in the industrial field. In the dental field, which has also adopted CT scanning, mouse has increasingly been used during dental treatments for manipulating computers in order to visually check the CT image data of target sites on computer screens by switching screens, moving view points on the image data, enlarging the image data while proceeding the treatments. When a mouse is used in treatment room or operating room, the mouse should be sterilized for infection control. For example, it is effective to perform autoclave sterilization (high-pressure steam sterilization) at a pressure in the range of 2 to 2.2 atm, at a temperature in the range of 121 to 135° C., and for approximately 20 minutes. The possibility of damaging mouse substantially, however, makes it difficult to perform such sterilization on mouse.

Japanese Patent Application Laid-Open No. 9-319515 (Patent Literature 1) discloses an invention related to a mouse. Patent Literature 1 describes a mouse for a computer including an upper mouse casing made of an antibacterial synthetic resin that is touched by a user operating a button by hand.

SUMMARY OF THE INVENTION

Although the mouse of Patent Literature 1 includes the upper mouse casing made of an antibacterial synthetic resin that is touched by a user operating a button by hand, the mouse does not include any special sealing means between the upper mouse casing and the button. Therefore, if the mouse is used under a wet condition, some moisture may enter the mouse through the gap between the upper mouse casing and the button, and damage the electronic circuits in the mouse, resulting in the failure of the mouse. Accordingly, the mouse can only be used under limited conditions. In addition, a cover of the mouse of Patent Literature 1 consists of a single layer and the material of the cover does not have enough heat resistance and pressure resistance. The mouse is thus hardly resistant to the change in the external pressure and temperature. The mouse can only be used under limited conditions in this regard, too.

The object of the present invention is to provide a mouse that can be used in an expanded range of the usage conditions.

According to one embodiment of the present invention, the mouse includes a circuit board having a detection circuit for detecting movement, at least one switch, and a transmission circuit for wirelessly transmitting the data related to the movement detected at the detection circuit and the data related to the operation of the switch to the outside. The circuit board and a power source are mounted on a bottom part made of hard resin. The bottom part is covered with a housing made of hard resin. The housing and the bottom part constitute a shell. The housing and the bottom part are strong enough to endure the change in the external pressure and temperature. The housing and the bottom part accommodate the circuit board and the power source.

The outer surface of the shell (or the housing) may be covered with a cover. In this case, an adhesive, an adhesive sheet, or a heat insulating sheet may be interposed between the shell (or the housing) and the cover. The adhesive, the adhesive sheet, or the heat insulating sheet may be made of special materials for achieving required bonding strength, heat insulating properties, pressure resistance, and heat blocking properties.

According to another embodiment of the present invention, the mouse includes at least one button made of hard resin disposed through the upper part of the shell (or the housing) in a sealed state for operating the switch, or a portion of the shell (or the housing) that can be pressed to be deformed unevenly for turning on and off the inside switch so as to minimize the loss of the heat insulating effect.

According to yet another embodiment, the mouse includes a waterproof switch disposed on the surface of the shell (or the housing) instead of the button disposed through the shell (or the housing) for operating the switch. This waterproof switch does not slide on the shell (or the housing) and can be pressed to be operated. The entire area of the outer surfaces of the shell (the bottom part and the housing) and the button is covered with a cover made of an elastic, heat-resistant, and waterproof material such as rubber, silicone rubber, and resin. The internal space formed by the shell (the bottom part and the housing) and the button is thereby sealed.

Examples of the fine particles (heat insulating particles) to be mixed with the resin to enhance the heat insulating properties include ceramic vacuum beads, hollow silicone beads, hollow glass beads, hollow resin particles, and hollow silica nanoparticles.

A pressure control valve mechanism may be disposed in the shell (the bottom part or the housing) for controlling the pressure in the mouse.

BRIEF DESCRIPTIONS OF THE DRAWINGS

DESCRIPTIONS OF THE PREFERRED EMBODIMENTS

Figure 1:
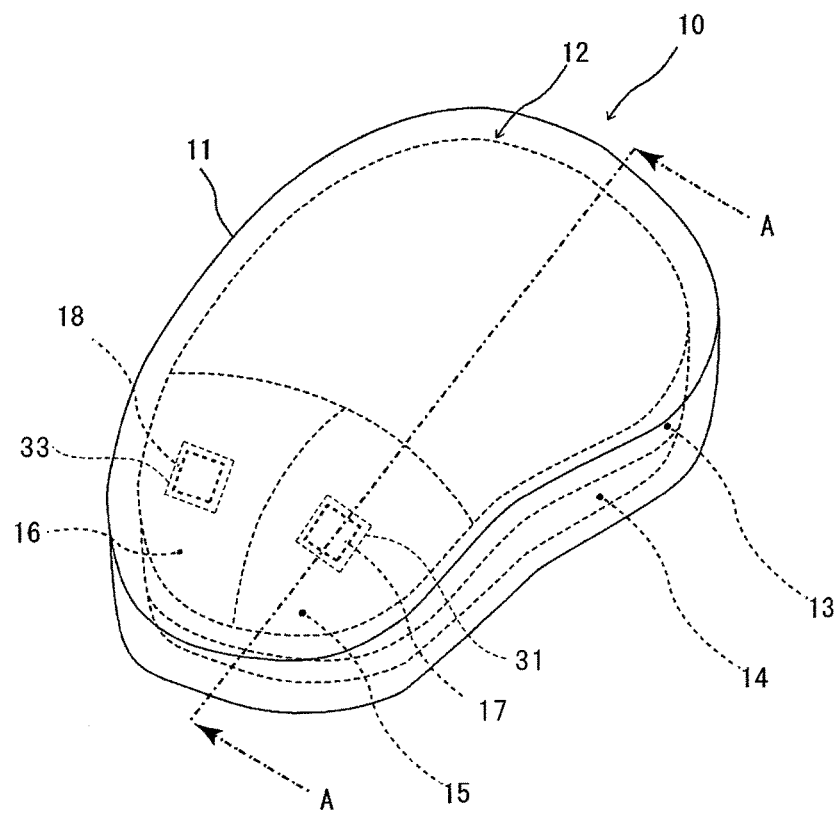
FIG. 1 is a perspective view of an exterior of a mouse according to a first embodiment of the invention.

Hereinafter, a mouse according to the present embodiment will be described with reference to the accompanying drawings. In the following description, components having substantially the same function and configuration are denoted by the same reference characters, and the description thereof is repeated only when necessary.

First Embodiment

Figure 2:
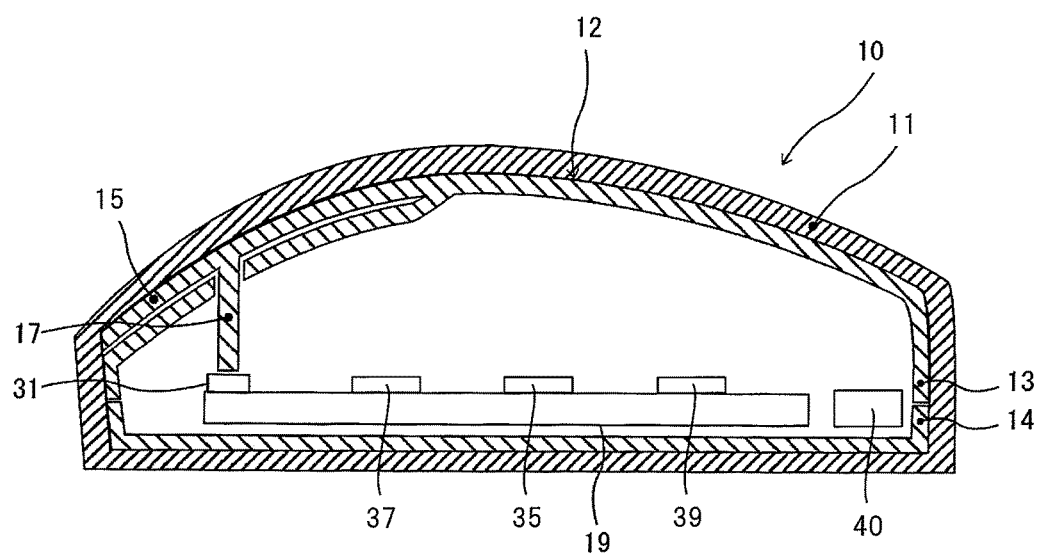
FIG. 2 is a cross-sectional view taken along a line A-A of FIG. 1.
Figure 3:
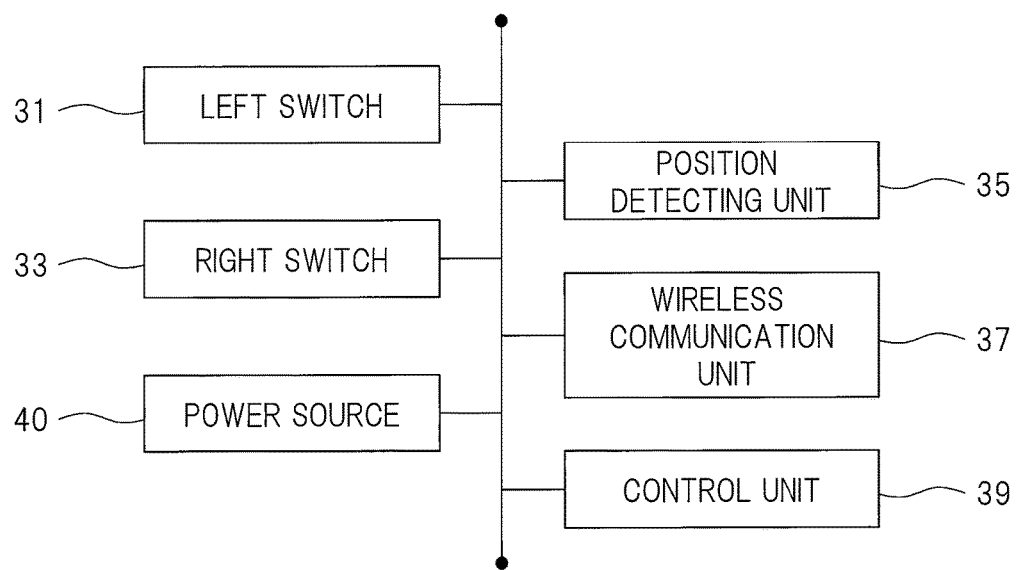
FIG. 3 is a block diagram illustrating the structure of the mouse of FIG. 1.

FIG. 1 is a perspective view of the exterior of a mouse 10 according to the first embodiment of the invention. FIG. 2 is a cross-sectional view of the mouse 10 taken along a line A-A of FIG. 1. FIG. 3 is a block diagram illustrating the structure of the mouse 10 of FIG. 1. The mouse 10 functions as a man-machine interface for allowing a user to input instructions related to moving a cursor or selecting a menu on a display screen, for example, to a computer.

The mouse 10 includes a shell 12. The shell 12 includes a plurality of members. In this embodiment, the shell 12 includes a bottom part 14, a housing 13, and click buttons 15 and 16. The shell 12 may consist only of the housing 13 and the bottom part 14. The shell 12 may have a single structure or may have a composite structure consisting of two or more parts other than the structure consisting of the housing 13 and the bottom part 14 in this embodiment. The composite structure may be divided into two or more parts along a line or lines higher than the middle line of the shell 12 in the height direction, along a line or lines in the length direction or the width direction of the mouse 10, or along any other line or lines other than the line dividing the shell 12 into the housing 13 and the bottom part 14 in this embodiment.

The bottom part 14 is a generally elliptic disk made of hard resin. The bottom part 14 holds a circuit board 19 and a power source 40 on its upper surface. The circuit board 19 includes a detection circuit for detecting movement, at least one switch, a transmission circuit for wirelessly transmitting the data related to the movement detected at the detection circuit and the data related to the operation of the switch to the outside, as described in detail later.

The housing 13 is a generally elliptic dome made of hard resin. The housing 13 covers the bottom part 14 to accommodate the circuit board 19 and the power source 40. The housing 13 includes at least one mechanism for operating a switch in its upper part. In this embodiment, at two sites, the housing 13 includes two click buttons 15 and 16 in a sealed state for operating left and right switches 31 and 33, respectively, (described later in detail) or portions that can be pressed to be deformed unevenly for turning on and off the inside switches 31 and 33 so as to minimize the loss of the heat insulating effect. The inside of the click buttons 15 and 16 are connected to prism-shaped click rods 17 and 18. The click rods 17 and 18 are penetrating the housing 13 at two sites in a sealed state and extending toward the bottom part 14. The tips of the click rods 17 and 18 are respectively matched or aligned to the left and right switches 31 and 33 on the circuit board 19. When the click button 15 is pressed down, for example, the switch 31 is also pressed via the click rod 17. As described later, the entire areas of the outer surfaces of the bottom part 14, the housing 13, and the click buttons 15 and 16 are covered with an elastic, heat-resistant, and waterproof cover 11 made of a material such as rubber, silicone rubber, and resin, which provides the mouse with waterproofness, heat resistance, and shock resistance.

The housing 13 and the bottom part 14 constituting the shell 12 are made of materials containing bar-like glass fibers having a higher heat resistance and a higher strength than a resin for the housing 13 or materials containing solid contents having a shape facilitating undercut. The glass fibers may previously be subjected to silane coupling for enhancing the adhesion to the main material for the housing 13. The housing 13 is then subjected to laser beams, electromagnetic waves, light, flame, radiant heat, or conductive heat to melt and remove the entire area of the outer surface of the housing 13 or a part of the outer surface of the housing 13. This exposes some of the glass fibers contained in the housing 13. The randomly exposed glass fibers can exert the coupling force necessary for forming two layers of the cover 11 and joining the cover 11 to the housing 13.

The circuit board 19 includes a plurality of electronic components corresponding to the switches 31 and 33, a position detecting unit 35, a wireless communication unit 37, and a control unit 39. The power source 40 includes a primary battery such as a dry cell and a button cell. The power source 40 supplies power to the control unit 39 and other units. The switches 31 and 33 generate on/off signals in response to physical contact.

The position detecting unit 35 typically includes a light-emitting device such as a laser and a blue LED, and an image sensor. The light-emitting device emits light. The light emitted from the light-emitting device passes through an optical device including a front lens and a prism to be ejected from a translucent portion in the bottom part 14. Part of the light ejected from the translucent portion in the bottom part 14 and diffusely reflected by an object such as a mouse pad travels back through a rear lens in the optical device and forms an image at the image sensor. The position detecting unit 35 calculates the direction and amount of the movement of the mouse 10 based on the change in the sequent images read by the image sensor. After the position detecting unit 35 calculates the direction and amount of the movement of the mouse 10, the related data is sent to the control unit 39. The position detecting unit 35 may include an accelerometer having at least two axes instead of the light-emitting device and the image sensor. In this case, the position detecting unit 35 calculates the direction and amount of the movement of the mouse 10 based on the output data from the 2-axis accelerometer.

The wireless communication unit 37 repeatedly transmits the data related to the movement of the mouse 10 and the on/off signals from the switches 31 and 33 to a wireless receiving unit of a computer under the control of the control unit 39. The wireless communication scheme may be any radio wave communication scheme such as an infrared communication scheme and Bluetooth (registered trademark). The wireless communication scheme may use sound waves in an audible range that human beings can easily hear or sound waves in a high audible range that human beings can hardly hear.

The cover 11 uniformly covers the entire area of the shell 12 of the mouse 10 including the bottom part 14, the housing 13, and the click buttons 15 and 16. Specifically, the cover 11 intimately contacted to the outer surfaces of the bottom part 14, the housing 13, and the click buttons 15 and 16. The cover 11 is formed on the assembled bottom part 14, housing 13, and click buttons 15 and 16 by insert molding, which may improve the adhesiveness and coupling force. The cover 11 may be made of an elastic, heat-resistant, and waterproof material such as rubber, silicone rubber, and resin. In this embodiment, the cover 11 is made of elastic resin for ensuring button operability. Examples of the elastic resin include natural rubber, silicone rubber, nitrile rubber, urethane rubber, and fluoro-rubber. In terms of heat resistance, waterproofness, durability, transparency, as well as elasticity, the cover 11 should preferably be made of silicone rubber or fluoro-rubber. The surface of the cover 11 may be lubricated for improving movability.

The cover 11 uniformly and integrally covers the entire areas of the outer surfaces of the bottom part 14, the housing 13, and the click buttons 15 and 16 without any gap. This completely seals the internal space of the mouse 10 formed by the bottom part 14, the housing 13, and the click buttons 15 and 16. The cover 11 completely isolates the inside of the mouse 10 from outside liquid and preferably from outside gas.

The housing 13, the bottom part 14, and the click buttons 15 and 16, which constitute the shell 12, are made of the same hard resin and this hard resin has resistance to and strength against the change in pressure and temperature. Examples of the hard resin include general-purpose resins such as polyethylene (PE), polypropylene (PP), polystyrene (PS), acrylonitrile/styrene resin (AS), acrylonitrile/butadiene/styrene resin (ABS), and polyvinyl chloride (PVC), general-purpose engineering resins such as polyamide (PA), polyacetal (POM), polycarbonate (PC), modified polyphenylene ether (m-PPE), and polyethylene terephthalate (PET), and super engineering resins such as liquid crystal polymer (LCP), polyphenylene sulfide (PPS), polyimide (PI), polyether sulfone (PES), polyether ether ketone (PEEK), polytetrafluoroethylene (PTFE), and polyamide-imide (PAI). In terms of pressure resistance and heat resistance, the hard resin is typically PPS, PES, and PEEK, and should most preferably be PPS in the super engineering resins.

The high hardness of the shell 12 keeps the shape of the mouse 10 to protect the circuit board 19 in the shell 12. The high elasticity of the cover 11 allows a user to easily press the click buttons 15 and 16 under the cover 11. The high transparency of the cover 11 improves the visibility of the front and rear sides of the mouse 10 and the click buttons 15 and 16 for a user. The high elasticity and transparency of the resin cover 11 and the high hardness of the resin shell 12 improve the operability of the mouse 10 for a user. The high heat resistance and waterproofness of the cover 11 and the high heat resistance of the shell 12 allow the mouse 10 to be subjected to heat sterilization. Examples of the heat sterilization include autoclave sterilization and dry heat sterilization. The autoclave sterilization is performed at a pressure in the range of 2 to 2.2 atm, at a temperature in the range of 121 to 135° C., and for approximately 20 minutes, for example. The dry heat sterilization is performed at a temperature in the range of 180 to 200° C. and for 30 minutes in dry air, for example.

For example, silicone rubber is not denatured even at a temperature above 150° C. and can endure continuous use for 10,000 hours or more even at a temperature above 200° C. In addition, silicone rubber is not denatured by water immersion. Silicone rubber retains a low water absorption of 1% even after a long-hour water immersion regardless of the temperature of the water such as cool water, warm water, or boiling water. PES, one of the super engineering resins, has a deflection temperature under load in the range of 200 to 210° C., and has an operating temperature in the range of 180 to 190° C. in accordance with the product safety standard set by Underwriters Laboratories Inc. (UL).

For example, if silicone resin, which has a siloxane bond with a silicon-oxygen bond as a skeleton, is used for the mouse 10, the mouse 10 will exhibit a higher heat resistance than a mouse using other organic material such as an organic rubber having a carbon-carbon bond as a skeleton.

In other words, the resin cover 11 having a high waterproofness and a high heat resistance and the resin shell 12 having a high heat resistance allow the mouse 10 to retain its strength even if the mouse 10 is exposed to high-temperature and high-pressure steam during autoclave sterilization. This allows the mouse 10 to be used as an input device for a computer in operating rooms that require sterilization of the mouse 10 before or after each use, for example.

This embodiment does not deny the possibility of applying general-purpose resins and engineering resins to the hard resin for the shell 12 and applying other resins to the elastic resin for the cover 11. The elastic resin for the cover 11 and the hard resin for the shell 12 may be selected from various resins in accordance with the usage conditions of the mouse 10. For example, when the mouse 10 is designed to be used in wet but not high-temperature places such as kitchens and bathrooms, the cover 11 may be made of nitrile rubber having a waterproofness substantially equal to that of silicone rubber but a lower heat resistance than that of silicone rubber. The shell 12 may be made of an engineering resin or a general-purpose resin such as polyvinyl chloride (PVC). When the mouse 10 is designed to be used in not wet but dusty places such as factories, the cover 11 may be made of urethane rubber having a low waterproofness and a low heat resistance.

Second Embodiment

According to the second embodiment, the mouse 10 includes a structure for securing the cover 11 to the shell 12.

Figure 4:
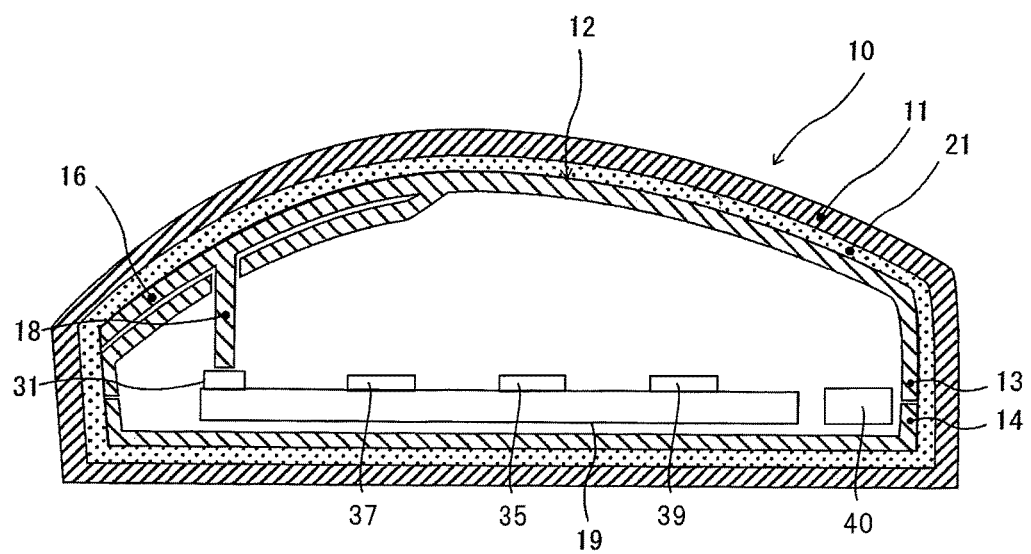
FIG. 4 is a cross-sectional view of a mouse according to a second embodiment of the invention.
Figure 5:
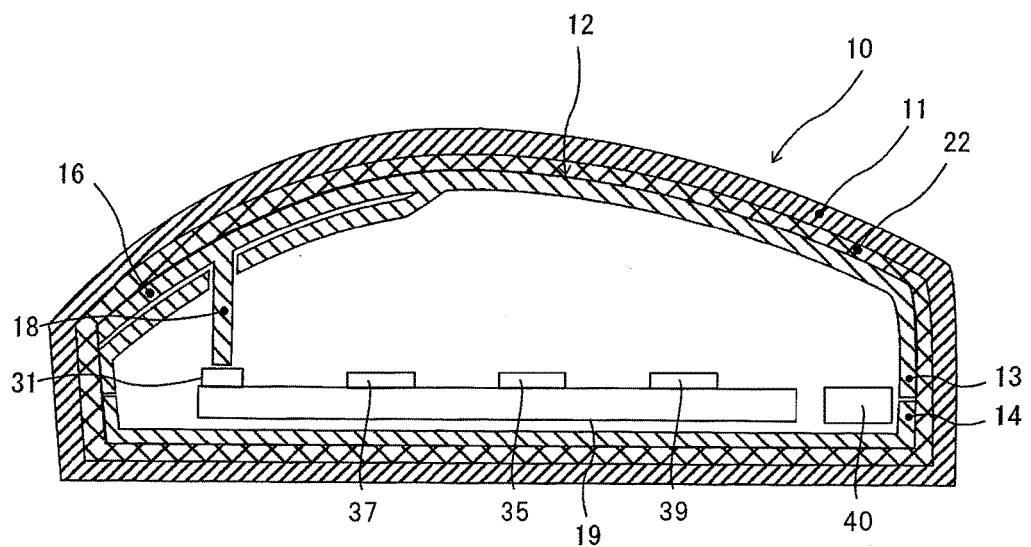
FIG. 5 is a cross-sectional view of another example of the mouse according to the second embodiment of the invention.

FIG. 4 is a cross-sectional view of the mouse 10 according to the second embodiment. FIG. 5 is a cross-sectional view of another example of the mouse 10 according to the second embodiment.

As illustrated in FIG. 4, the cover 11 is bonded to the shell 12 with an adhesive 21. This firmly bonds the cover 11 to the shell 12. The firmly bonding of the cover 11 to the shell 12 prevents the cover 11 from laterally sliding on the shell 12 when the mouse 10 is moved, which improves the operability of the mouse 10. An elastic epoxy adhesive is used to ensure the substantial adhesive strength of the adhesive 21. The elastic epoxy adhesive has a high heat resistance and prevents the deterioration of the adhesive strength due to the heat process on the mouse 10.

Some of the methods for bonding the cover 11 to the shell 12 (i.e. the housing 13 and the bottom part 14) other than the above method will now be described.

The method using the epoxy adhesive as the adhesive 21 is described above.

In another method, a sheet containing the same component as that for the shell 12 is used as the adhesive 21, which facilitates the fusion bond between the adhesive 21 and the shell 12. This sheet has mechanical undercuts in its outer surface (the contact surface to the cover 11). The undercuts are previously made for achieving the engagement with the material of the cover 11 at the time of forming two layers of the cover 11 to complete the bonding.

In yet another method, the adhesive 21 between the shell 12 and the cover 11 contains microfibers such as cellulose fibers, cellulose nanofibers, and carbon fibers. The fibers are firmly engaged with the shell 12 and the cover 11, which achieves the firm bonding therebetween.

In yet another method, the sheet as the adhesive 21 between the shell 12 and the cover 11 has microfibers suitable for the shell 12 and the cover 11. The fibers are previously planted on both sides of the sheet for achieving firmer bonding at the time of forming two layers of the cover 11.

As temperature varies in the usage conditions of the mouse 10, the internal temperature inside the cover 11 varies. As the internal temperature inside the cover 11 rises, the volume of the gas inside the cover 11 increases. As the volume of the gas increases, the internal pressure increases. This may cause the cover 11 to come off the shell 12. The possibility of the detachment can be reduced by firmly bonding the cover 11 to the shell 12 with the adhesive 21.

To reduce the possibility of the detachment, the mouse 10 may be made such that its internal pressure is below the atmospheric pressure at a reference temperature (25° C., for example). In this case, even if the internal pressure increases with the rise in the internal temperature inside the cover 11, the increased internal pressure, which will still be below the atmospheric temperature (1 atm), will allow the atmospheric pressure to press the cover 11 onto the shell 12 and reduce the possibility of the cover 11 coming off the shell 12. The mouse 10 may have a vacuum inside the cover 11, however, the internal pressure of the mouse 10 should be set at a pressure that does not adversely affect the pressing operation and restoring movement of the click buttons 15 and 16 and the switches 31 and 33.

The internal space formed by the housing 13, the bottom part 14, and the click buttons 15 and 16, which constitute the shell 12, may be filled with insulating resin. The resin, which has a substantially lower coefficient of thermal expansion than gas, can efficiently reduce the possibility of the detachment of the cover 11 due to the increased internal pressure.

As illustrated in FIG. 5, an adhesive sheet 22 may be interposed between the shell 12 and the cover 11 to improve the bonding strength between the cover 11 and the shell 12 (the housing 13 and the bottom part 14). The adhesive sheet 22 is made of a resin having a high compatibility with the resin for the shell 12 (the housing 13 and the bottom part 14) and containing inorganic fibers or organic fibers. Examples of the inorganic fibers include glass fibers, steel fibers, and carbon fibers. Examples of the organic fibers include olefin fibers, polyvinyl alcohol fibers, pulp fibers, cellulose fibers, cellulose nanofibers, and other natural fibers such as hemp. The adhesive sheet 22 may be made of a resin having a high compatibility with both of the resin for the cover 11 and the resin for the shell 12. The adhesive sheet 22 is a sheet made of the same resin as that for the shell 12 and containing glass fibers such as a PPS sheet containing glass fibers. After forming the shell 12, a high-temperature silicone rubber is poured over the adhesive sheet 22 on the outer surface of the shell 12. The heat of the silicone rubber fuses the adhesive sheet 22 and the outer surface of the shell 12. The adhesive sheet 22 is firmly bonded to the outer surface of the shell 12 by the fusion of the resin of the adhesive sheet 22 and the resin of the outer surface of the shell 12. When the silicone rubber is poured over the adhesive sheet 22 in fusion, the silicone rubber gets tangled with the glass fibers in the adhesive sheet 22. This firmly bonds the adhesive sheet 22 and the cover 11 to each other. The shell 12 and the cover 11 are firmly bonded to each other by insert molding of the cover 11 on the shell 12 while the adhesive sheet 22 is interposed between the shell 12 and the cover 11. The bonding strength can be enhanced by the compatibility, however, a method using primer may be used additionally or solely other than the bonding using the compatibility.

The adhesive sheet 22 may be made of polyphenylene sulfide (PPS) and contain flexible fine fibers such as Japanese paper fibers, cellulose fibers, cellulose nanofibers, carbon fibers, or glass fibers, as a bonding material. The adhesive sheet 22 may be made of a PPS resin bonding material such as a PPS sheet containing fine hollow tubes of PPS resin, and a PPS sheet having numerous asperities or undercuts formed by special laser processing. The adhesive sheet 22 may contain heat insulating particles or hollow ceramic beads to enhance the bonding strength and heat insulating properties. The adhesive sheet 22 may be made of a sheet containing PPS tubes or an adhesive containing ceramic hollow beads to provide the adhesive sheet 22 with heat insulating properties.

Third Embodiment

Figure 6:
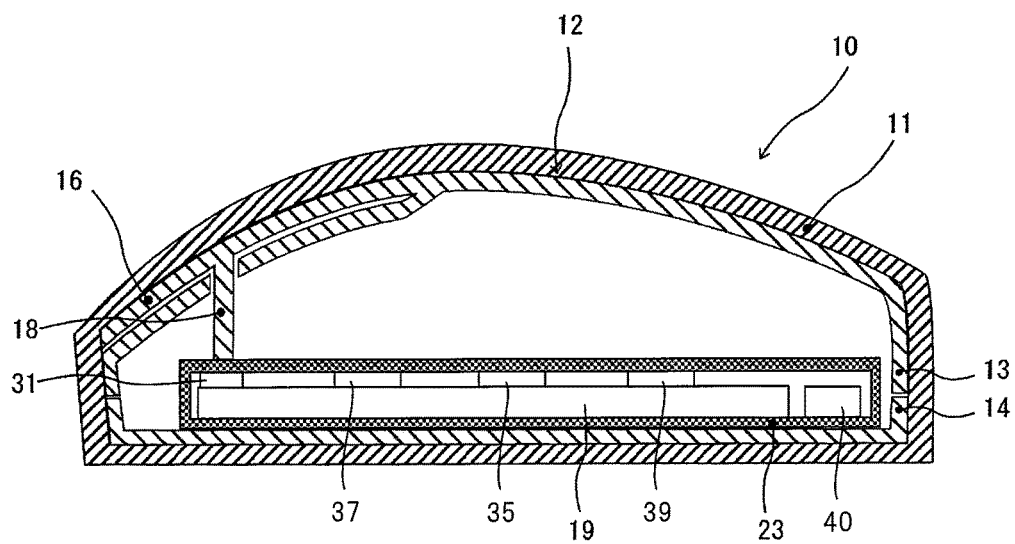
FIG. 6 is a cross-sectional view of a mouse according to a third embodiment of the invention.
Figure 7:
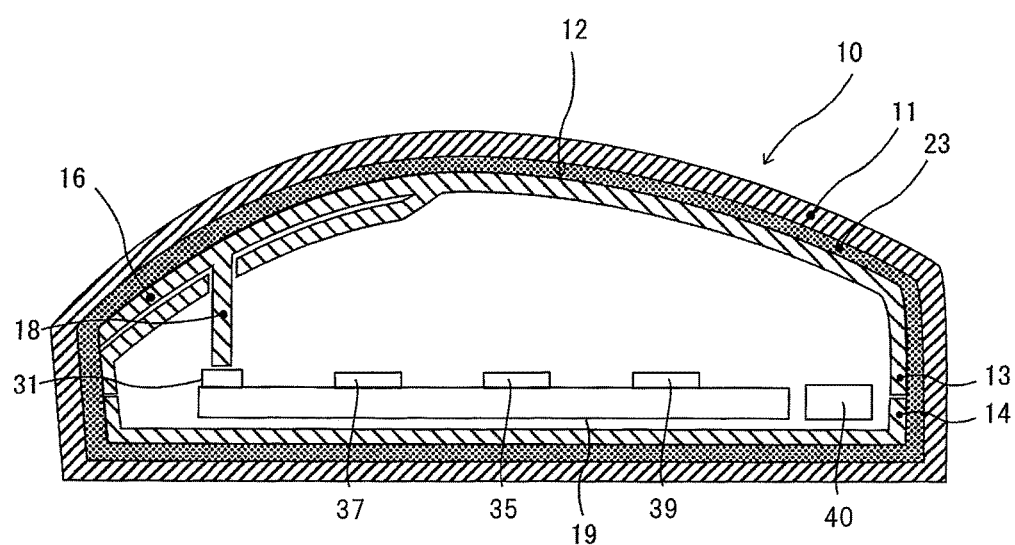
FIG. 7 is a cross-sectional view of another example of the mouse according to the third embodiment of the invention.

The electronic part including the electronic devices, circuits, and elements on the circuit board 19 and the power source 40 should be protected from the heat applied during autoclave sterilization, for example. To that ends, it is effective to enclose the circuit board 19 and the power source 40 with a heat insulating material. According to the third embodiment, the mouse 10 has a structure for improving the heat insulating properties. FIG. 6 is a cross-sectional view of the mouse 10 according to the third embodiment. FIG. 7 is a cross-sectional view of another example of the mouse 10 according to the third embodiment.

As illustrated in FIG. 6, a heat insulating sheet 23 encloses the entire circuit board 19 in the shell 12. The heat insulating sheet 23 is made of fibers containing heat insulating particles. Examples of the fibers include glass fibers and pulp fibers. Examples of the heat insulating particles include ceramic vacuum beads, hollow glass beads, hollow resin beads, and hollow silica nanoparticles, which has very high heat insulating properties due to their very high heat reflectivity and conductivity. The heat insulating sheet 23 enclosing the circuit board 19 and the power source 40 in the shell 12 thus restricts the rise in the internal temperatures of the circuit board 19 and the power source 40.

The heat insulating sheet 23 may be made of a heat insulating material of paper having heat insulating properties (heat insulating paper) and the heat insulating paper may contain heat insulating particles such as ceramic vacuum beads, hollow silicone beads, hollow glass beads, hollow resin particles, and hollow silica nanoparticles. As illustrated in FIGS. 6 and 7, the heat insulating sheet 23 encloses the electronic devices such as the circuit board 19, the position detecting unit 35, the wireless communication unit 37, the control unit 39, and the power source 40 to enhance the heat insulating effect. If the heat insulating sheet 23 consists of two or three layers, the heat insulating effect will further be enhanced.

The position of the heat insulating sheet 23 is not limited to the position described above. As illustrated in FIG. 7, the heat insulating sheet 23 may be disposed between the shell 12 and the cover 11 to restrict the rise in the internal temperature due to the rise in the outside temperature. This restricts the rise in the internal temperature as in the above example, and protects the electronic part including the electronic devices, circuits, and elements on the circuit board 19, and the power source 40 from the heat applied during autoclave sterilization, for example. The heat insulating sheet 23 at this position improves the adhesion between the shell 12 and the cover 11 as well as the heat insulating effect.

To restrict the rise in the internal temperature due to the rise in the outside temperature, at least one of the shell 12 and the cover 11 may contain heat insulating particles such as ceramic vacuum beads, hollow glass beads, hollow resin particles, and hollow silica nanoparticles, which enhances the heat insulating properties of the shell 12 and the cover 11.

Fourth Embodiment

Figure 8:
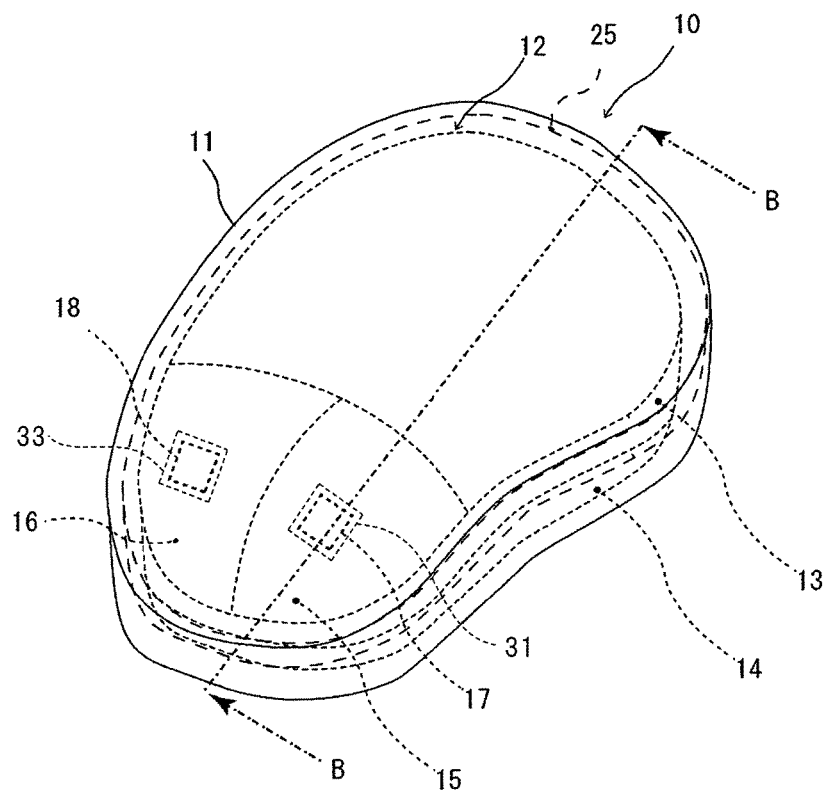
FIG. 8 is a perspective view of an exterior of a mouse according to a fourth embodiment of the invention.
Figure 9:
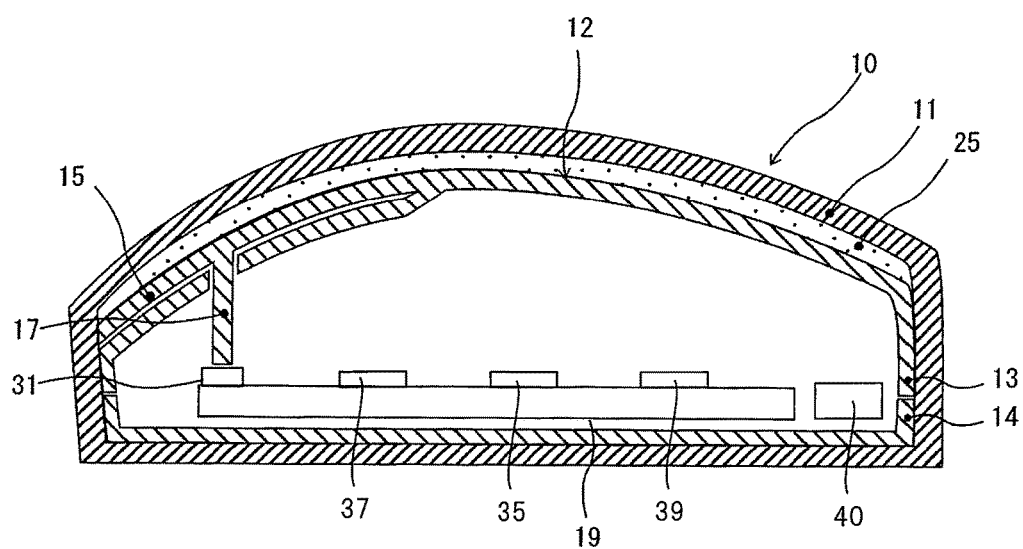
FIG. 9 is a cross-sectional view taken along a line B-B of FIG. 8.

According to the fourth embodiment, the mouse 10 has a charging function. FIG. 8 is a perspective view of the exterior of the mouse 10 according to the fourth embodiment. FIG. 9 is a cross-sectional view taken along a line B-B of the mouse 10 of FIG. 8. The mouse 10 may have a power generating function. Specifically, the power source 40 includes a secondary battery, a solar panel 25, and a charging circuit. The secondary battery is a lithium ion battery, for example. The solar panel 25 may have flexibility and is disposed on the entire area of the upper surface of the shell 12 under the cover 11. The solar panel 25 converts solar energy or light energy from a fluorescent light into electricity. The secondary battery is charged with the power generated by the solar panel 25 via the charging circuit. The secondary battery then provides the power to the units such as the control unit 39. The mouse 10 with a power generating function can be used as a wireless mouse 10 and expands the range of the usage conditions of the mouse 10. The solar panel 25 may be disposed on a part of the upper surface of the shell 12. For example, the solar panel 25 may be disposed on the rear part of the upper surface of the shell 12 while excluding the surfaces of the click buttons 15 and 16. By disposing the solar panel 25 as such, since the solar panel 25 does not cover the surfaces of the click buttons 15 and 16, repeatedly pressing the click buttons 15 and 16 does not damage the surface of the solar panel 25 and does not lead to the strength deterioration of the solar panel 25.

The mouse 10 may have a non-contact charging function. Specifically, the power source 40 includes a secondary battery and a non-contact charging unit. The non-contact charging scheme may be an electromagnetic induction scheme using electromagnetic induction, an electromagnetic field resonance scheme using resonance in an electromagnetic field, a radio wave scheme that converts electromagnetic waves received with an antenna in the mouse 10 into electricity, an ultrasonic wave scheme that converts ultrasonic waves received with a piezoelectric device in the mouse 10 into electricity, or a vibration scheme using the changes in an electromagnetic field caused by reciprocating a magnet along the central axis of a solenoid coil in the mouse 10.

The above wireless transmitting mechanism and this wireless charging mechanism provide a functional isolation from the outside while the cover 11 provides a physical isolation from the outside, which achieves the waterproofness, dustproofness, soil resistance, and shock resistance. In addition, the heat insulating properties achieved by each layer allow the mouse 10 to be subjected to high-pressure steam sterilization under an autoclave environment.

Fifth Embodiment

Figure 10:
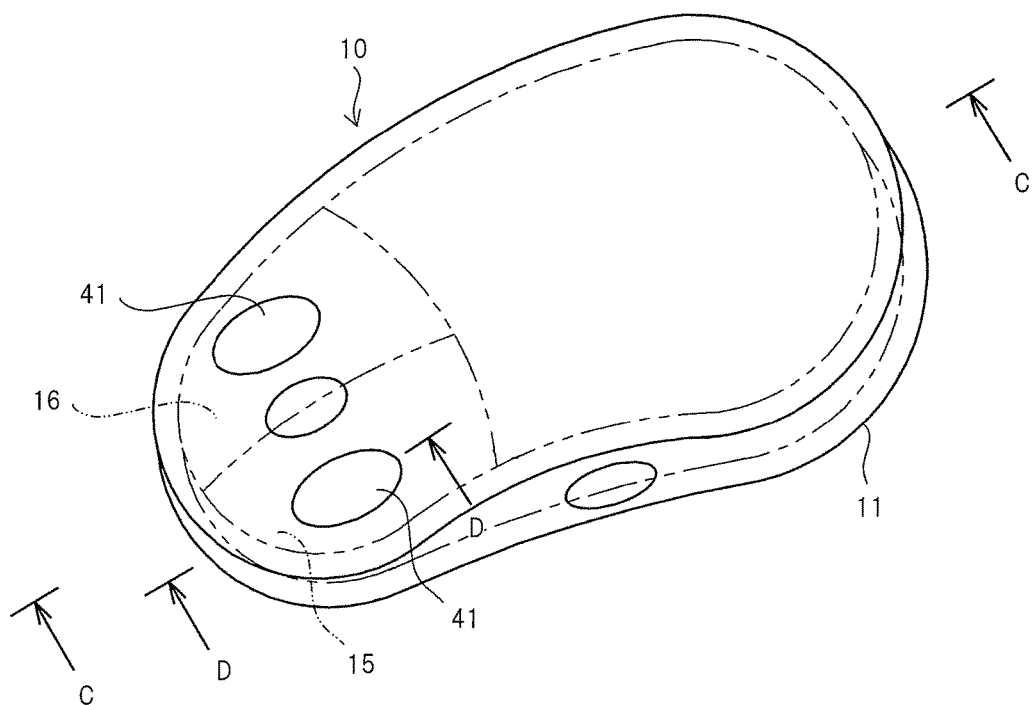
FIG. 10 is a perspective view of a mouse according to a fifth embodiment.
Figure 11:
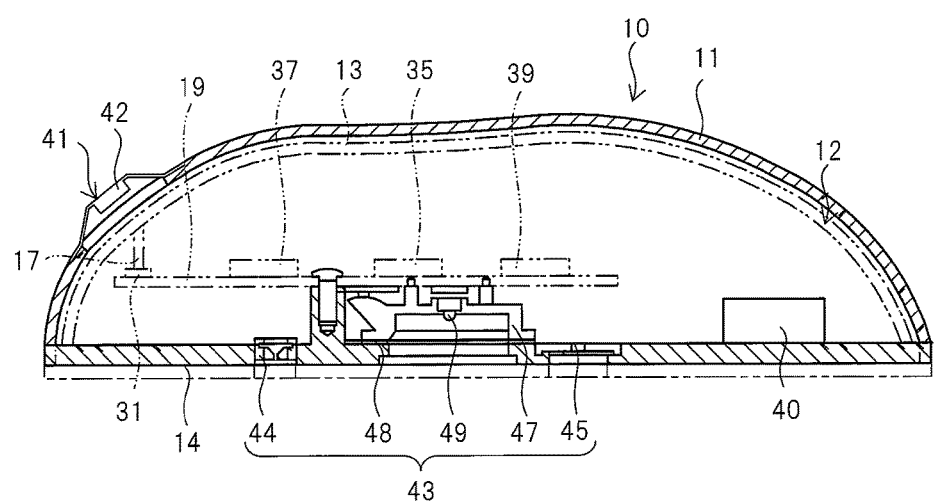
FIG. 11 is a cross-sectional view taken along a line C-C of FIG. 10.
Figure 12:
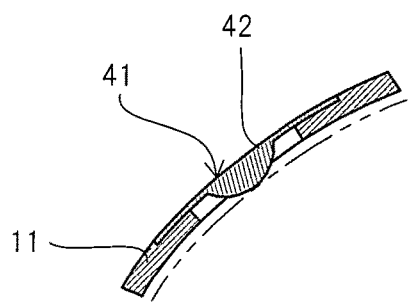
FIG. 12 is an enlarged cross-sectional view of a waterproof switch disposed on the surface of the mouse with a touch piece pressed down taken along a line D-D of FIG. 10.

The fifth embodiment of the present invention will now be described. FIG. 10 is a perspective view of the mouse according to the fifth embodiment, FIG. 11 is a cross-sectional view taken along a line C-C of FIG. 10, and FIG. 12 is an enlarged cross-sectional view of a waterproof switch disposed on the surface of the mouse with a touch piece pressed down taken along a line D-D of FIG. 10.

According to the fifth embodiment, the cover 11 only covers the housing 13 out of the shell 12 of the mouse 10 including the housing 13 and the bottom part 14. The housing 13, the bottom part 14, and the cover 11 can be made of the materials described in the above embodiments and the descriptions about the materials are omitted here.

In this embodiment, the housing 13 includes a waterproof switch 41 on its outer surface. The waterproof switch 41 can be pressed down from the position of FIG. 11 to the position of FIG. 12 by pressing an elastic rubber touch piece 42 in the thickness direction. When the waterproof switch 41 is pressed down to the position of FIG. 12, the waterproof switch 41 comes in contact with the outer surface of the housing 13 and a conductive portion in the housing 13, for example, which activates the mouse 10. It is also possible to activate the mouse 10 by pressing down the touch piece 42 to elastically deform the housing 13 and press an unshown member (such as a click rod in the above embodiments). In that case, the electrical connection between the touch piece 42 and the mouse 10 may be achieved in a wireless scheme or a wired scheme. In some cases, an unshown click rod may be disposed in the internal space inside the shell 12 as in the above embodiments.

In the fifth embodiment, a pressure control valve mechanism 43 is disposed in the bottom part 14 to control the pressure in the internal space inside the shell 12 including the housing 13 and the bottom part 14. The pressure control valve mechanism 43 includes a one-way pressure reducing valve 44 and an on-off valve 45. The pressure reducing valve 44 automatically reduces the pressure in the internal space of the mouse 10 by releasing some of the inside gas to the outside when the pressure in the internal space inside the shell 12 exceeds a predetermined pressure due to the heat applied during high-temperature sterilization such as autoclave sterilization. The on-off valve 45 can manually be operated as needed for taking the air into the internal space inside the shell 12 when the internal pressure drops due to cooling after the high-temperature sterilization. The pressure control valve mechanism 43 maintains a proper pressure in the internal space inside the shell 12 as needed when the pressure in the mouse 10 varies depending on the usage conditions, which maintains an optimal operating environment for the electronic devices in the mouse 10.

Also in this embodiment, the electronic devices such as the circuit board 19, the position detecting unit 35 having a detection circuit for detecting the movement of the mouse, the wireless communication unit 37 having a transmission circuit for wirelessly transmitting the data related to the movement detected at the detection circuit and the data related to the operation of the switch to the outside, the control unit 39 for performing various controls, and the power source 40 are disposed in the internal space inside the shell 12. The circuit board 19 includes or is provided with the position detecting unit 35, the wireless communication unit 37, and the control unit 39. The power source 40 is secured to the upper surface of the bottom part 14 with a battery holder (not shown).

With respect to the position detecting unit 35, a translucent lens 47 is disposed in the bottom part 14 via a sealing packing 48 and a light-emitting device 49 is also disposed in the bottom part 14 as an image sensor for optically sensing the movement of the mouse 10.

As illustrated by chain double-dashed lines in FIG. 11, the cover 11 may cover not only the housing 13 but also the entire area of the shell 12 including the bottom part 14. In this case, the cover 11 covers the entire area of the outer surface of the mouse 10 except for the openings of the pressure reducing valve 44 and the on-off valve 45 in the shell 12 or the bottom part 14. In this structure, the area of the cover 11 corresponding to the light-emitting device 49 may be a transparent area or a translucent area, or the entire area of the cover 11 may be made of a transparent material or a translucent material for allowing the light emitted from the light-emitting device 49 to pass through the cover 11.

In the description of the first embodiment, the basic structure of the mouse 10, the joining of the cover 11 to the shell 12 without an adhesive sheet, and the heat insulating properties and waterproofness of the mouse 10 have been described. In the description of the second embodiment, the structure for bonding the cover 11 to the shell 12 with an adhesive sheet, and the heat insulating properties, pressure resistance, and waterproofness of the mouse 10 have been described. In the description of the third embodiment, the structure of the mouse 10 having the heat insulating properties around the electronic circuits and electronic devices has been described. In the description of the fourth embodiment, the structure of the mouse 10 having a power generating function and the structure of the mouse 10 having a non-contact charging function have been described. In the description of the fifth embodiment, the mouse 10 including a pressure control valve mechanism with a pressure reducing valve and an on-off valve, and a waterproof switch provided on the surface has been described. The mouse 10 may be configured by freely combining the functions and structures described in these embodiments depending on the usage conditions.

The embodiments of the present invention shall not be limited to a mouse. If input devices such as joysticks and keyboards are covered with the cover 11, these input devices will obtain similar effects as the effects obtained by the mouse 10 of the embodiments of the present invention. For example, if a keyboard is covered with the cover 11, the inside of the keyboard can completely be isolated from outside liquid or more preferably from outside gas. If operation panels of equipment in operating rooms such as computed tomography (CT) scanners, magnetic resonance imaging (MRI) scanners, X-ray equipment, and display devices are covered with the cover 11, such equipment will obtain similar effects as the effects obtained by the mouse 10 of the embodiments of the present invention.

The present invention shall not be limited to the above embodiments and can be modified within the scope of the invention defined by the claims. The embodiments obtained by properly combining the technical features and methods disclosed in the above embodiments will be within the scope of the present invention. In addition, new technical features and methods can be achieved by combining the technical features and methods disclosed in the above embodiments.

What is claimed is:

1. A mouse having heat resistance, pressure resistance, and waterproofness to endure repeated steam sterilizations at high temperature and high pressure in a sterilization apparatus, comprising:
    a hard resin shell forming an external shape of the mouse;
    a switch for operating the mouse;
    an electronic device including a power source disposed in an internal space inside the hard resin shell, a position detecting unit disposed in the internal space inside the hard resin shell for detecting movement of the mouse, and a wireless communication unit disposed in the internal space inside the hard resin shell for wirelessly transmitting signals from the position detecting unit and the switch to outside;
    a heat insulating sheet enclosing the electronic device; and
    a resin cover for covering an entire area of an outer surface of the hard resin shell;
    wherein the heat insulating sheet is disposed between and in direct contact with the hard resin shell and the resin cover.

2. The mouse according to claim 1, wherein the heat insulating sheet includes two or three layers.

3. The mouse according to claim 1, wherein the hard resin shell includes a bottom part and a housing covering the bottom part for accommodating the electronic device in the internal space.

4. The mouse according to claim 1, wherein at least one of the hard resin shell and the resin cover contains heat insulating particles.

5. A mouse having heat resistance, pressure resistance, and waterproofness to endure repeated steam sterilizations at high temperature and high pressure in a sterilization apparatus, comprising:
    a bottom part holding a circuit board including a position detecting unit for detecting movement of the mouse, at least one switch for operating the mouse, and a wireless communication unit for wirelessly transmitting data related to the movement of the mouse detected at the position detecting unit and data related to operation of the at least one switch to outside, and a power source;
    a shell made of hard resin and covering the bottom part while accommodating the circuit board and the power source, the hard resin shell having resistance to and strength against change in pressure and temperature;
    at least one button disposed on an upper part of a housing for operating the at least one switch;

a cover integrally covering entire areas of outer surfaces of the bottom part, the housing, and the at least one button without any gap; and a heat insulating sheet enclosing the circuit board provided with the position detecting unit and the wireless communication unit, and the power source;

wherein the heat insulating sheet is disposed between and in direct contact with the shell made of hard resin and the cover.

\* \* \* \* \*